United States Patent

Hepner et al.

[11] 4,112,367
[45] Sep. 5, 1978

[54] MAGNETOMER USING A THIN MAGNETIC FILM OPTICAL WAVEGUIDE WITH A.C. MODULATION AND AUTOMATIC NULLING

[75] Inventors: Georges Hepner; Bernard Désormiére, both of Paris, France

[73] Assignee: Thomson-CSF, Paris, France

[21] Appl. No.: 806,479

[22] Filed: Jun. 14, 1977

[30] Foreign Application Priority Data

Jun. 18, 1976 [FR] France .................. 76 18600

[51] Int. Cl.² ............................................ G01R 33/02
[52] U.S. Cl. ................................. 324/244; 324/96; 356/96.13; 356/151
[58] Field of Search ............... 324/43 R, 43 L, 96, 324/244; 350/151, 96.12, 96.13

[56] References Cited

U.S. PATENT DOCUMENTS

| 2,844,789 | 7/1958 | Allen | 324/43 L |
| 2,861,242 | 11/1958 | Leavitt | 324/43 R |
| 2,913,665 | 11/1959 | Bomke | 324/43 L |
| 3,996,576 | 12/1976 | Bullock | 350/151 |

Primary Examiner—Robert J. Corcoran
Attorney, Agent, or Firm—Cushman, Darby & Cushman

[57] ABSTRACT

The present invention relates to devices intended to measure magnetic fields, and also known as magnetometers. It consists in using a zeroing method to measure the influence of the Faraday effect of the field being measured, upon a radiated energy beam propagating in guided fashion through a thin film of magnetic material.

7 Claims, 3 Drawing Figures

MAGNETOMER USING A THIN MAGNETIC FILM OPTICAL WAVEGUIDE WITH A.C. MODULATION AND AUTOMATIC NULLING

BACKGROUND OF THE INVENTION

The present invention relates to devices designed to measure a magnetic field. Devices of this kind, also known as magnetometers, are used in particular to prepare charts of the earth's magnetic field in the course of geological prospecting operations.

It is known to measure magnetic fields using various physical effects of the field. For example, the electromotive force induced by the field in a rotating coil, can be measured. However, to achieve adequate sensitivity and accuracy, it is necessary to employ methods which involve a considerable amount of very delicate equipment. Thus, the most recent method to be used consists in measuring the resonance frequency of the protons in a material such as hydrogen, immersed in the field to be measured.

SUMMARY OF THE INVENTION

In accordance with the present invention, there is provided a device for measuring an external magnetic field, which comprises:

means for generating a light beam linearly polarized along a first direction;

a thin film of magnetic film for propagating said light beam in a first guided mode corresponding to said first direction of polarization and in a second guided mode under the influence of said external magnetic field; the distribution of said light beam between said two modes being dependent on the intensity of said external magnetic field;

means for extracting from said thin film the portion of said light beam corresponding to said second guided mode, and delivering a deviated beam; and means for measuring the intensity of said deviated beam and computing the intensity of said magnetic field.

BRIEF DESCRIPTION OF THE DRAWINGS

For a better understanding of the invention, and to show how the same may be carried into effect, reference will be made to the ensuing description and to the attached figures among which.

DETAILED DESCRIPTION OF THE DRAWINGS

Figure 1:
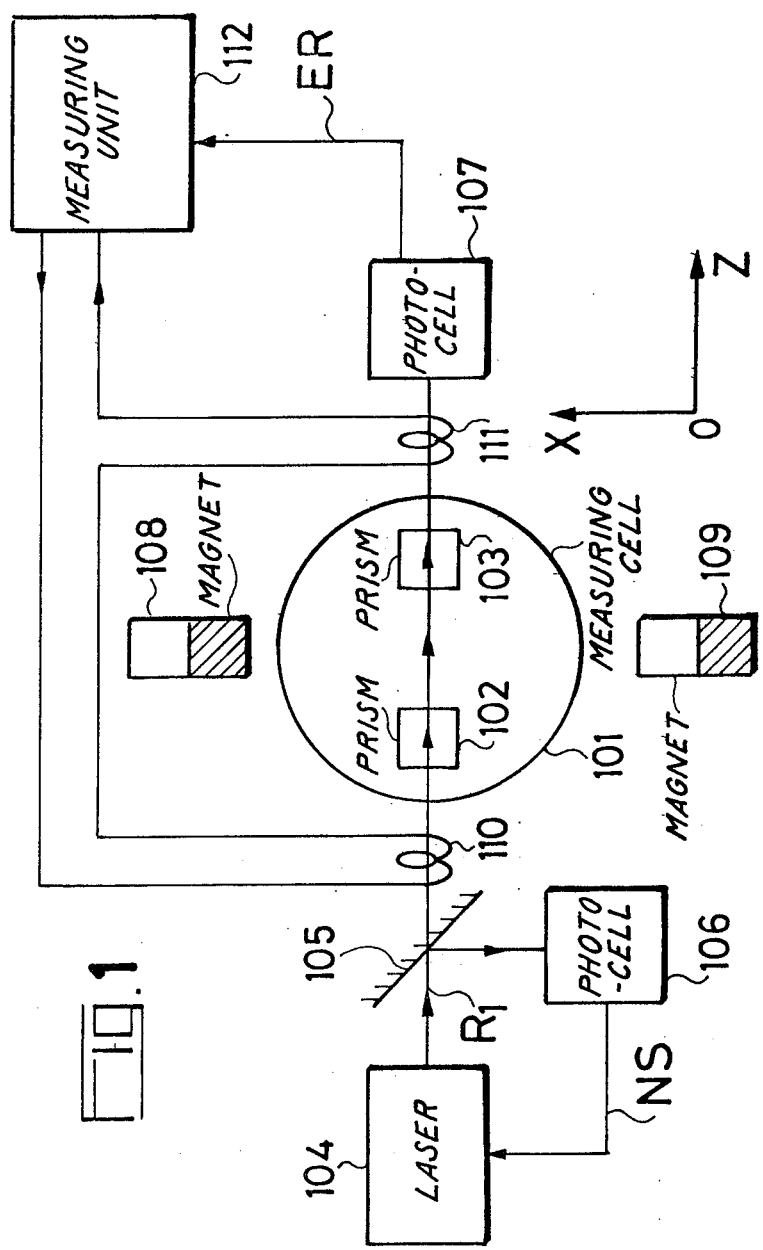
FIG. 1 illustrates the diagram of a device in accordance with the invention.

FIG. 1 illustrates a device in accordance with the invention, comprising a measuring cell 101 equipped with two prisms 102 and 103, a source of radiated energy 104, a semi-transparent mirror 105, two photo-cells 106 and 107, two magnets 108 and 109, two coils 110 and 111 and a measuring unit 112.

The radiated energy source 104, for example a laser, emits a parallel monochromatic beam $R_1$. In the example described the beam is constituted by infra-red light with a wavelength of 1.15 $\mu$m, this value being particularly well suited for use with the measuring cell employed.

The beam passes through the semi-transparent mirror 105 which reflects a small part of it, for example 10%, onto the photo-cell 106. In the present instance, this photo-cell makes it possible to monitor the level of the beam $R_1$ and it emits a control signal NS which is supplied to the laser 104. This signal NS thus enables the laser 104 to be better stabilised.

Figure 2:
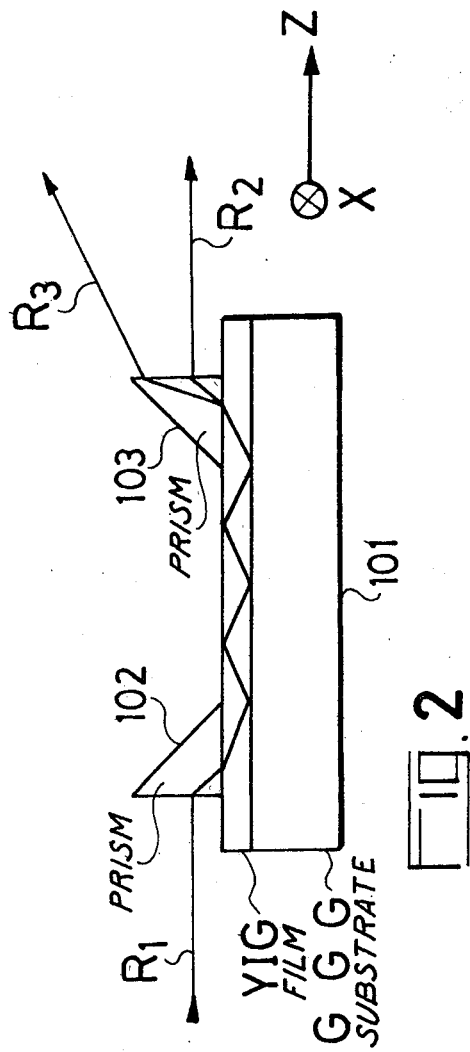
FIG. 2 illustrates the diagram of the measuring cell of the device shown in FIG. 1.

The beam emerging from the mirror 105 arrives at the measuring cell 101. The cell has been shown in FIG. 2. It essentially comprises a thin film of magnetisable material whose optical properties depend upon the strength and direction of the magnetic field in the film. A certain number of such materials are known, and in the example described a gadolinium and gallium substituted yttrium-iron garnet, popularly known as YIG, is used. This garnet is deposited in the form of a thin mono-crystalline film by an epitaxial process, on a GGG substrate, namely a gadolinium-gallium garnet. This method of production yields a film which can act as a waveguide vis-a-vis determinate radiations, in the present instance infra-red light of 1.15 $\mu$m wavelength. The phenomena occuring are entirely comparable with those encountered in microwave work, this indeed because of the common nature of light and radio waves. Thus, in order to describe these phenomena, the same vocabulary which is employed in the context of radio waveguides, will be used.

To inject the beam $R_1$ into the YIG film, the coupling prism 102 is used. In fact, since the beam has relatively large dimensions, a diameter of 1 mm, for example, and since the film is very thin, only some few $\mu$m at the most, this is the easiest coupling method to use. The beam $R_1$ arrives at the entry face of the prism 102 and is refracted within the prism through an angle which enables it to enter the YIG film. This prism is made of rutile in the present instance, on the one hand for reasons of compatibility of refractive index with the material of the film, and on the other hand because of the double-refracting properties of this substance, these properties being exploited in the exit prism 103.

The beam then propagates in a guided mode through the YIG film in a direction parallel to the beam $R_1$, also designated as the Z direction. This propagation has been illustrated in FIG. 2 by a broken line, namely a succession of total reflections at the top and bottom walls of the film, and this is a traditional representation of the mode of propagation in microwave waveguides.

When the beam arrives at the exit prism 103 total reflection ceases and it therefore enters the prism which refracts it and causes it to leave in the form of two beams $R_2$ and $R_3$. The presence of these two beams is due to the double-refracting properties of the prism 103, because depending upon whether the propagation mode is of the transverse magnetic type (T M) or the transverse electric type (T E), one or the other of these beams will be obtained. In this example, an incident beam $R_1$ which is polarized perpendicularly to the YIG film is used, this being readiy achieved by means of appropriate orientation of the laser 104, the light produced by a laser more often than not being polarized. This kind of orientation results in a guided wave in the film, which is of T M type, the polarization direction corresponding by convention to the direction of the electric field vector of the electromagnetic wave.

In the absence of any other phenomenon, the propagation will continue in the T M mode and the beam accordingly leaves the prism 103 in the form of the beam $R_2$, parallel to the beam $R_1$.

The presence of a magnetic field in the YIG film in the direction Z, induces by Faraday effect the advent of T E type propagation, the intensity being dependent upon the intensity of the field. To achieve proper efficiency in this T M/T E conversation mechanism, it is necessary to comply with known conditions pertaining to the composition of the film and its dimensions. This T E propagation then results in part of the beam leaving the prism 103 in the form of the beam $R_3$ contained in a plane perpendicular to the film and parallel to Z. The distribution between the beams $R_2$ and $R_3$ will be proportional to the distribution between the T M and T E modes.

For the phenomena to be properly clear, it is necessary that the vector representing the magnetic field in the YIG film should be contained in the plane of this film. To achieve this result, the film is saturated in the X direction, for example by means of two permanent magnets 108 and 109 which create a stable permanent field in this direction, so that, as it were, the magnetic field in the film is made to lie within the thickness of the latter. A good field value generated by these magnets would for example be 1 Oe, since this device is used in particular for measuring weak fields, the stronger fields being measurable without difficulty using ordinary methods. With the device then immersed in the field which is to be measured, the component of the latter in the direction OZ will slightly incline the field vector towards the left or towards the right of the direction X, in the plane of the film, thus including the advent with a greater or lesser intensity, of the beam $R_3$.

Since the effects used are not linear, it would be difficult to tie a direct measurement of the intensity of $R_3$ to the intensity of the magnetic field in the direction OZ. Preference has therefore been given to the use of a zero method. For this purpose, using the two coils 110 and 111 supplied from the measuring unit 112, an alternating magnetic field parallel to Z is created, this field therefore being parallel to the field which is to be measured. In this way, the intensity of the beam $R_3$ is modulated but this modulation in no way reproduces variations in the magnetic field since, in reality, the intensity of the beam $R_3$ depends solely upon the intensity of the T E mode and not upon its direction. Consequently, in the absence of a direct field in the direction Z, the intensity of $R_3$ varies in accordance with a law containing only even harmonics of the signal applied to the coils.

In the presence of a direct field or one varying slowly in relation to the frequency of the alternating field, in the direction Z, the advent of odd harmonics in the intensity of $R_3$ will be observed and, in particular, the fundamental, which did not exist earlier, will advent.

Then, the intensity of this beam is measured within the help of the photo-electric detector 107 which transmits to the measuring unit 112 an electrical signal ER reproducing the variations in the intensity.

The unit 112 contains in addition to an a.c. generator supplying the coils in the aforesaid fashion, a servo-mechanism which makes it possible to superimpose a direct compensating current on this alternating current. This direct current produces in the coils 110 and 111 a direct compensating magnetic field which is superimposed both on the alternating field and on the direct field which is to be measured. The servo-mechanism is adjusted so that the field induced by the direct current opposes the field which is to be measured. The error signal used to control this servo-mechanism is in fact the fundamental contained in the signal ER.

Thus, through the unit 112, the variations in the direct compensating field are controlled and the value of the latter established at a value which, with the exception of any imperfections in the system, cancels out the fundamental in the signal ER. This value is equal in absolute value to the field being measured, and by measuring it through the medium of the direct compensating current this zeroing method consequently makes it possible to obtain the value of the field being measured. The relationship between the value of the compensating current and that of the field is simple to determine, either in an absolute way by very accurate measurement of the dimensions of the coils, which may for example be Helmholtz coils using a highly uniform field, or in a relative way by using a calibrating method which can be performed by an conventional method using a relatively strong field since the field-current relationship is linear.

It should perhaps be mentioned at this juncture that the magnetic permeability of the GGG substrate and the YIG film does not affect the situation since we are dealing here with a zeroing method in which one field is compensated by the other within one and the same material. The same applies to any hysteresis which may be present since the alternating measuring field in fact makes it possible to permanently follow the hysteresis cycle as the resultant field decreases towards zero, this making it possible to achieve a true zero.

Figure 3:
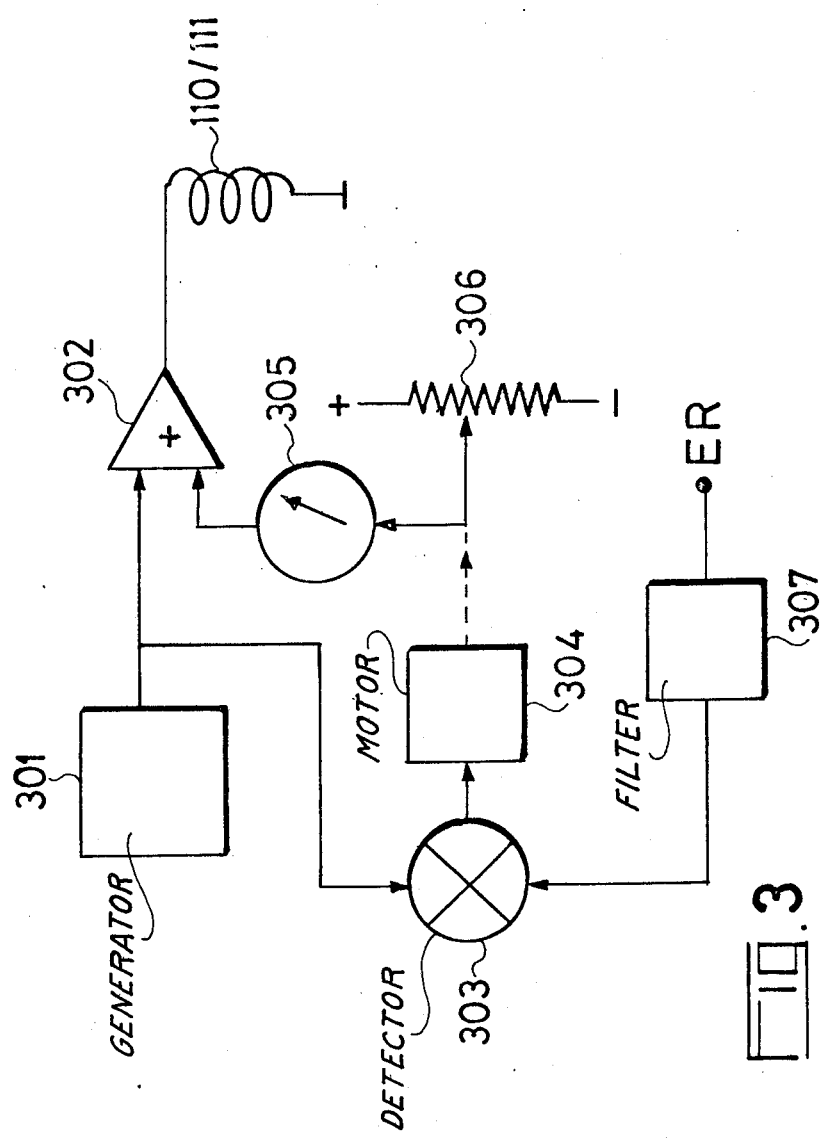
FIG. 3 illustrates the diagram of the measuring unit 112 of the device shown in FIG. 1.

FIG. 3 illustrates an embodiment of the measuring unit 112, comprising a generator 301, and adder 302, a synchronous detector 303, a motor 304, a potentiometer 306, a measuring instrument 305 and a filter 307.

The generator 301 emits a sinusoidal signal, for example at 10,000 Hz. This frequency represents a good compromise between the speed of response and performance of the filter, on the one hand, and the magnetic losses occurring in the sensitive film, on the other. The signal is applied to the coils 110/111 through the medium of the adder 302.

The signal ER coming from the detector 107 is applied to the filter 307 which makes it possible to extract the 10 kHz fundamental. The thus filtered signal is then applied to the synchronous detector 303 which is also supplied with the reference signal emitted by the generator 301.

The synchronous detector 303 detects the fundamental in the filtered signal coming from the filter 307 so that the latter is not absolutely essential, however it is useful to prevent saturation phenomena and parasitic reactions when the fundamental reduces. This detector emits a signal whose amplitude depends upon the amplitude of the fundamental present in ER, and which cancels out at the same time as the latter. In addition, the polarity of this signal depends upon the phase of the fundamental in relation to the phase of the reference signal. This phase changes through 180° depending upon whether the compensating field is co-directional with or opposes the field being measured. As a matter of fact, the direction of rotation of the polarisation angle under the Faraday effect does not depend upon the direction of propagation of the light; the graph plotting this angle as a function of the field is therefore symmetrical in relation to the angle axis and it will readily be appreciated that this brings about a change in phase of the fundamental in the signal ER.

The signal emitted by the detector 303 is therefore a true control signal which cancels out and changes sign when equilibrium between the compensating field and the field being measured is achieved.

This signal is applied to the motor 304 which through the medium of a mechanical linkage symbolised by the broken line arrow, controls the displacement of the cursor of the potentiometer 306.

This potentiometer is supplied symmetrically in relation to earth, from a stabilised voltage source which has not been shown in the figure, and which corresponds to the + and − signs at the terminals of the potentiometer. Thus, on the cursor of this potentiometer a voltage of variable polarity and modulus is available depending upon the position of the cursor and therefore upon the level of the fundamental in ER.

This voltage is applied through the medium of the measuring instrument 305 to the adder 302, making it possible to feed to the coils 110/111 the desired compensating current. This current is measured by the instrument 305.

The assembly of these elements is connected in such a fashion that a negative feedback is obtained. Thus, when equilibrium is reached the level of the fundamental in ER is at a minimum (zero but for parasitic effects) and corresponds to a given compensating current in the coils 110/111. This compensating current creates a magnetic field which compensates the magnetic field being measured and it is possible to directly graduate the dial of the instrument 305 in terms of magnetic field strength.

In order for the device to have good sensitivity, it is necessary to maximise the signal-to-noise ratio of the detector 107. One solution would be to use a photomultiplier. But in the present case better results have been obtained with an avalanche-type photodiode.

In a practical embodiment a 4.4 microns thick film has been used with a composition $Gd_{0.45} Y_{2.55} Fe_{4.2} Ga_{0.8} O_{12}$. This corresponds to optimum T M/T E conversion conditions as we have seen earlier. With a magnetic polarizing field $H_x$ of 1 Oe and a 10 kHz alternating field, it has been possible to measure fields of $10^{-6}$ Oe with a signal-to-noise ratio of 100 at a passband of 100 kHz.

Indeed, this kind of measuring device only measures the component parallel to Z. To measure all the parameters of the field it is necessary to use three devices of the same kind arranged in a three-axis system or possibly, to orientate the device in space by peaking the reading on the instrument.

What we claim is:

1. A device for measuring an external magnetic field having a given direction, which comprises:
   means for generating a first light beam having a linear polarization;
   a thin film of magnetic material immersed in said external magnetic field and extending along a plane in which said given direction extends, for propagating said first light beam along said given direction in a first guided mode corresponding to said linear polarization and in a second guided mode under the influence of said external magnetic field; the distribution of said light beam between said two modes being dependent on the intensity of said external field;
   means for coupling said first light beam into said thin film along said given direction;
   means for extracting from said thin film a second light beam corresponding to the portion of said first beam propagated in said second guided mode;
   means for applying to said thin film a fixed polarization magnetic field parallel to said plane and perpendicular to said given direction;
   means for applying to said thin film an AC magnetic field parallel to said given direction and having a given frequency, whereby the intensity of said second light beam is modulated;
   means for detecting in said second light beam an AC component having said given frequency and a first variable intensity and delivering a control signal representative of said first variable intensity;
   means for applying to said thin film a variable magnetic field having said given direction, opposed to said external magnetic field, and having a second variable intensity; and
   means for feedback controlling said second variable intensity under the control of said control signal until said first variable intensity is set to zero said second variable intensity being a measure of the external field.

2. A device as claimed in claim 1, wherein said thin film is an epitaxial film of gadolinium and gallium substituted yttrium-iron garnet, deposited onto a gadolinium gallium garnet substrate; the light beam being an infrared beam having a wavelength substantially equal to 1.15 μm.

3. A device as claimed in claim 2, wherein said coupling means comprise an entry prism and said extracting means comprise an exit prism constituted with double refracting material.

4. A device as claimed in claim 3, wherein the composition of said thin film is substantially given by the formula $Gd_{0.45} Y_{2.55} Fe_{4.2} Ga_{0.8} O_{12}$.

5. A device as claimed in claim 4, wherein said thin film has a thickness of substantially 4.4. μm.

6. A device as claimed in claim 5, wherein said given frequency is substantially equal to 10 kHz.

7. A device as claimed in claim 6, wherein said means for detecting includes an avalanche diode.

* * * * *